United States Patent [19]
Woo

[11] Patent Number: 5,442,306
[45] Date of Patent: Aug. 15, 1995

[54] FIELD PROGRAMMABLE GATE ARRAY USING LOOK-UP TABLES, MULTIPLEXERS AND DECODERS

[75] Inventor: Nam-Sung Woo, New Providence, N.J.

[73] Assignee: AT&T Corp., Murray Hill, N.J.

[21] Appl. No.: 304,013

[22] Filed: Sep. 9, 1994

[51] Int. Cl.⁶ .......................................... H03K 19/00
[52] U.S. Cl. .................................... 326/39; 326/40; 365/189.08
[58] Field of Search ............................ 326/39–40, 326/44, 49; 365/189.08

[56] References Cited

U.S. PATENT DOCUMENTS

| | | |
|---|---|---|
| 4,758,985 | 7/1988 | Carter .............................. 326/40 X |
| 4,831,573 | 5/1989 | Norman ............................ 326/40 X |
| 4,940,909 | 7/1990 | Mulder et al. ............. 365/189.08 X |
| 5,095,523 | 3/1992 | Delaruelle et al. ............. 326/44 X |
| 5,208,491 | 5/1993 | Ebeling et al. . |
| 5,237,219 | 8/1993 | Cliff . |
| 5,291,079 | 3/1994 | Goetting . |
| 5,311,080 | 5/1994 | Britton et al. . |
| 5,313,119 | 5/1994 | Cooke et al. . |
| 5,317,212 | 5/1994 | Wahlstrom ...................... 326/49 X |
| 5,317,698 | 5/1994 | Chan . |

*Primary Examiner*—David R. Hudspeth

[57] ABSTRACT

A programmable logic cell of a field programmable gate array having a decoder circuit arrangement for increasing the number of inputs to each programmable logic cell. The decoder circuit arrangement couples to the look-up table of each programmable logic cell.

15 Claims, 5 Drawing Sheets

FIELD PROGRAMMABLE GATE ARRAY USING LOOK-UP TABLES, MULTIPLEXERS AND DECODERS

BACKGROUND OF THE INVENTION

1. Field of the Invention

The present invention relates to programmable logic devices formed in integrated circuit semiconductor chips. More particularly, the invention relates to logic cells which are part of field programmable gate array chips.

2. Description of the Prior Art

Integrated circuits (ICs) have traditionally implemented a single function, or functions that were defined by software programming. However, in either case, the logic architecture that implemented the functionality was fixed during the design of the IC. More recently, integrated circuits have been developed whose logic architecture can be changed after manufacture. For example, Field Programmable Gate Arrays (FPGAs) have been developed whose logic functions can be established by the user. Typically, the logic functions are implemented in Programmable Function Units (PFUs) which generally includes various logic circuit elements (AND gates, OR gates, NAND gates, NOR gates, flip-flops, lookup table memory, multiplexers, registers, latches, and tri-state buffers, for example) that may be connected in a desired arrangement in order to implement desired logic and memory functions. For example, typical logic functions include combinational logic, adders, counters, and other data path functions. The combinational logic is typically performed using Look-up tables (LUTs), whereas sequential logic is typically performed using storage elements (registers) such as flip-flops and latches.

As mentioned above, each logic cell (or PLC: programmable logic cell) utilizes Look-up Tables (LUTs) to implement combinational logic functions. Typically, LUTs employ Static random access memory's (RAMs) to implement the Boolean functions in accordance with the combinational logic function of each PLC. It is noted, that "K" is to denote the maximum number of inputs which can be coupled to a Boolean network and can be implemented by an individual PLC of an FPGA. Typically, as the value of K increases, the number of levels (e.g., the depth) of LUTs (as well as PLCs) needed to implement application circuits (a circuit implemented in FPGA chip(s)) decrease which, in turn, effects less time delay (e.g., higher circuit speed). Therefore, it is often desirable to have a PLC with a large K value.

For example, FIG. 1 illustrates a prior art block diagram of a LUT 152 of a PLC 150. In particular, LUT 152 is a 16-bit RAM which enables PLC 150 to implement a Boolean function of up to four inputs (e.g., K=4). FIG. 2 illustrates a prior art block diagram of F and GLUTs 162 and 164 of a PLC 160. Both F and G LUTs 162, 164 are 16-bit RAMS enabling PLC 160 to implement a Boolean function of up to Five inputs A1, A2, A3, A4 and A5 (K=5) in correspondence with the circuit configuration of PLC 160 (inputs A2, A3 and A4 are common to both F and G LUTs). FIG. 3 illustrates a block diagram of a FPGA PLC 170 having the respective outputs of the aforementioned F and GLUTs 162 and 164 coupled to an 8-bit H LUT 172 enabling PLC 170 to implement some Boolean functions of up to nine inputs (A1 thru A9) (k=9) in correlation with the circuit configuration of PLC 170.

Therefore, the particular size (RAM) of the LUTs and their circuit configuration in a PLC determine the K value for the particular PLC. For example, the aforementioned PLC 150 (FIG. 2) is provided with 16-bit RAM F and GLUTS 162 and 164 of a combined size of 32 bits providing a K value of five. In contrast, the aforementioned PLC 170 (FIG. 3) has the identical 16-bit RAM F and GLUTS of a combined size of 32 bits providing a K value of eight (since the inputs (A1 to A4 and A6 to A9) of F and GLUTS were independent of one another). Further, an extra LUT may be added to the output terminals of F and GLUTS 162 and 164 in order to raise the K value. For example, the added H-LUT 172 in the PLC 170 (FIG. 3) functioned to increase the value of K by one. However, adding additional LUTS to a PLC increases signal propagation time (e.g., decreases the circuit speed), which is disadvantageous for most circuit applications. Further, an increase in the number of PLC levels in a FPGA correspondingly increases both the size and cost of the FPGA.

SUMMARY OF THE INVENTION

The present invention is directed towards a field programmable gate array integrated circuit having a multiplicity of PLCs, wherein each PLC includes a decoder circuit arrangement operative to increase the numbers of inputs (K) to each PLC. The decoder circuit arrangement is preferably coupled to each LUT of each PLC, whereby the number of inputs to the PLC is increased by the corresponding number of inputs of the aforementioned decoder circuit arrangement.

Each decoder circuit arrangement preferably includes a multiplexer circuit coupled to a LUT of a PLC. Further provided is a decoder circuit having a plurality of input terminals with its output terminal connected to the address selector of the multiplexer circuit. In a preferred embodiment, the multiplexer circuit includes a 2 to 1 MUX having its first input terminal coupled to an output terminal of a LUT and its second input terminal connected to a default value. The address selector of the 2 to 1 MUX is coupled to and controlled by the aforementioned decoder circuit.

Therefore, the decoder circuit arrangement of the present invention increases the power of each PLC by increasing the maximum number of inputs (K) for the Boolean network associated with the FPGA without necessitating the need to add additional layers of LUTs to the circuitry FPGA.

BRIEF DESCRIPTION OF THE DRAWINGS

The foregoing features of the present invention will become more readily apparent and may be understood by referring to the following detailed description of an illustrative embodiment of an apparatus according to the present invention, taken in conjunction with the accompanying drawings, in which.

DETAILED DESCRIPTION OF THE PREFERRED EMBODIMENTS

Figure 1:
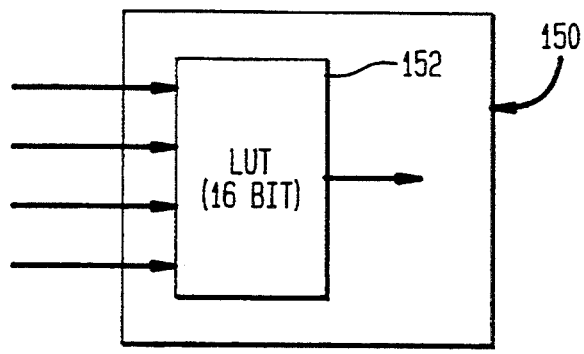
FIGS. 1–3 illustrate block diagrams of prior-art programmable logic cells in alternative circuit configurations.
Figure 2:
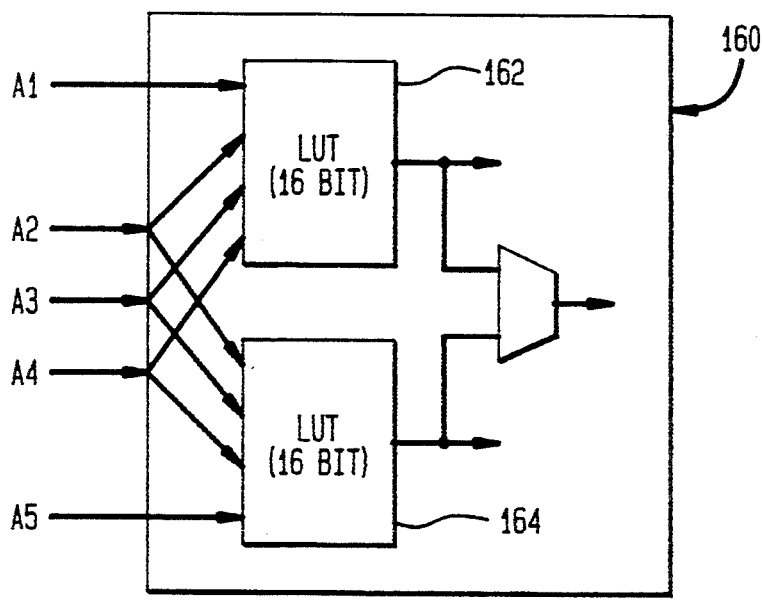
Figure 3:
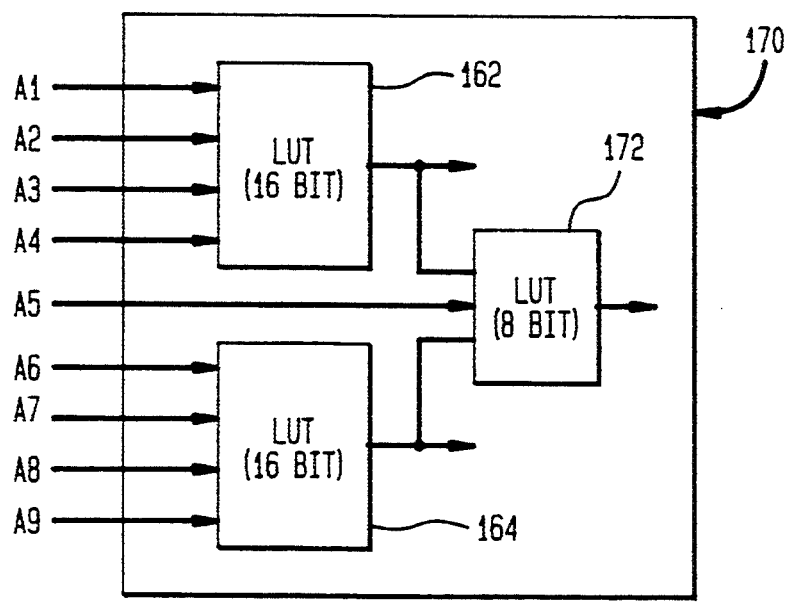
Figure 4:
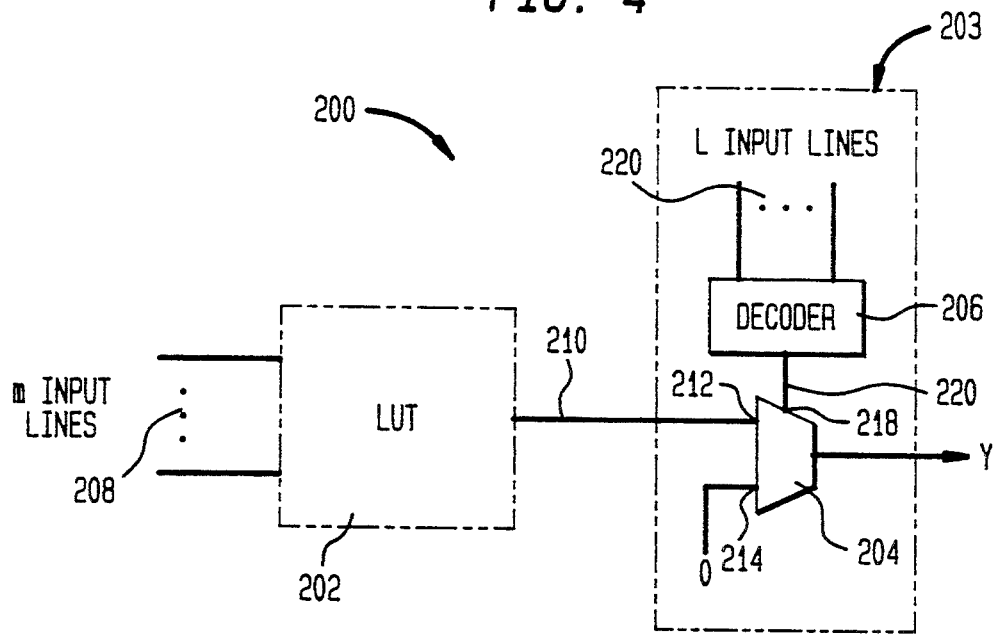
FIG. 4 illustrates a programmable logic cell implementing the decoder circuit arrangement embodying the present invention.

Referring now to the drawings, in which like reference numerals identify similar or identical elements, FIG. 4 illustrates a portion of a programmable logic cell (PLC) 200 including a look-up table (LUT) 202 coupled to the decoder circuit arrangement 203 of the present invention. The decoder circuit arrangement 203 in its simplest embodiment includes a multiplexer (MUX) 204 and a conventional decoder circuit 206. It is to be appreciated by one skilled in the art, that PLC 200 may be implemented into the integrated circuitry of commercially available FPGAs, such as the ORCA FPGA, commercially available from AT&T. Generally, the provision of the decoder circuit arrangement 203 to a PLC 200 is functional to increase the number of inputs (K) to a PLC 200 without the aforementioned disadvantages associated with adding additional layers of LUT circuitry.

In reference to FIG. 4, and by way of example, LUT 202 is of the order $2^m$ bits, whereby LUT 202 can implement a Boolean network having m inputs 208 (e.g., K=m). For example, if LUT 202 is of the order of 16 bits ($2^m$=16, m=4), LUT 202 is then adapted to implement a Boolean network having up to 4 inputs (K=4). The output line 210 of LUT 202 is coupled to a first input terminal 212 of preferably a 2 to 1 MUX 204. The second input 214 terminal of MUX 204 is coupled to a default value (0). The address selector terminal 218 of MUX 204 is coupled to the decoder circuit 206. As is well known, such a decoder circuit 206 is a device for translating a combination of input signals into one output signal representative of the input combinational signal. By way of example, decoder circuit 206 is adapted to have L input lines 220. Therefore, the decoder circuit 206 is operative to have either an logic high (1) or logic low (0) output at its output terminal (line 220) in dependence upon the combinational values of the L inputs 220. It is to be appreciated by one skilled in the art that the translation scheme of the decoder circuit 206 may be readily configured to have a logic high (1) or logic low (0) output value in dependence upon particular input combinational values to the decoder circuit 206.

As is also conventional, the value inputted (e.g., 0 to 1) to address selector 218 of MUX 204 is determinative to select which input terminal (212 or 214) is to be coupled to the output terminal Y. Preferably, MUX 204 is adapted to be active low (0), whereby when the output (line 220) of decoder circuit 206 is logic low (0), the first input terminal 212 of MUX 204 is coupled to its output Y. For example, when the output of decoder circuit 206 is logic low (0), the Y output value of MUX 204 equals the output value of LUT 202, via output line 210. When the output of decoder circuit 206 is logic high (1), the Y output value of MUX 204 is equal to the default value (0) of the second input terminal 214.

Therefore, as described above with reference to FIG. 4, PLC 200 is provided with m+L inputs (K=m+L), whereby PLC 200 is enabled to implement a Boolean function having a maximum of m+L inputs thereinto. For example, if LUT 202 is an 8-bit LUT (m=3) and decoder circuit 206 is configured to have 5 inputs (L=5), the PLC 200 is then enabled to implement a Boolean function having a maximum of 8 inputs (K=8=3+5). Thus, the decoder circuit arrangement 203 is operative to increase the number of inputs (K) to PLC 200 by a factor of (L).

Figure 5A:
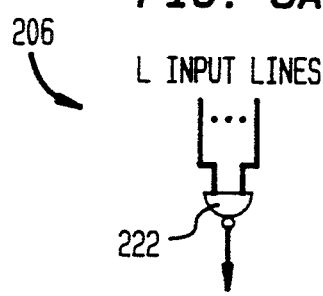
FIGS. 5a to 5c illustrate alternative circuit configurations for the decoder circuit arrangement of FIG. 4.
Figure 5B:
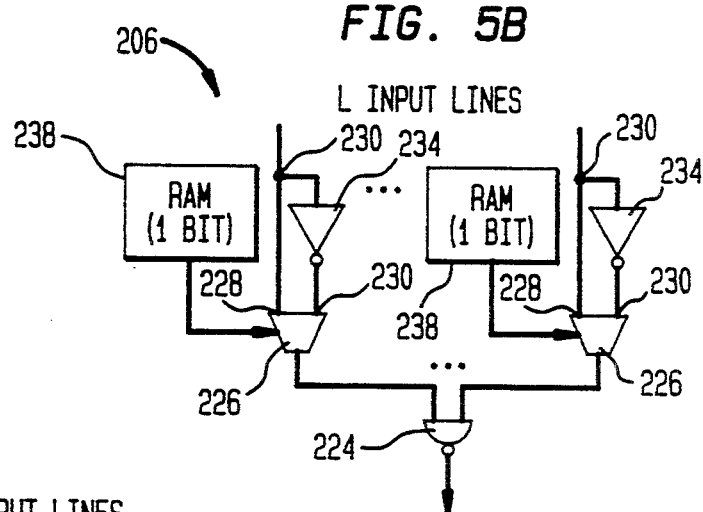
Figure 5C:
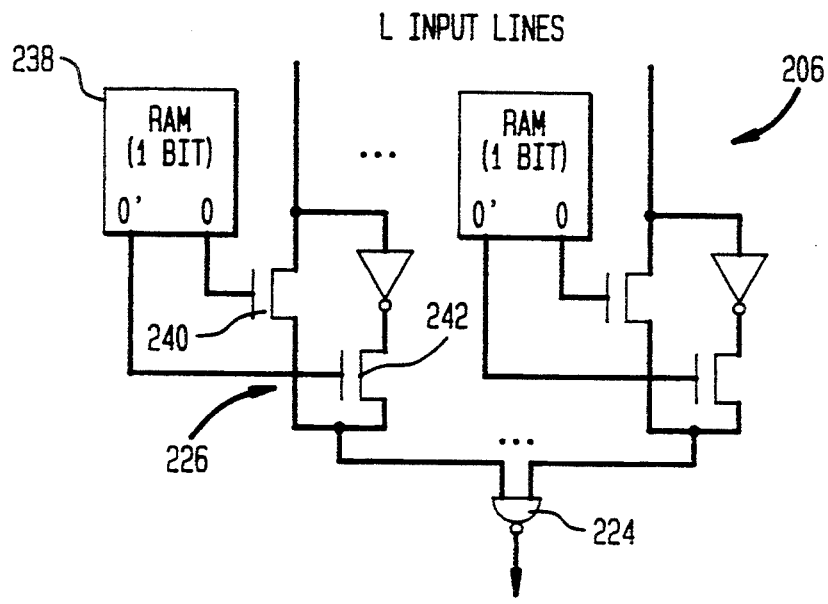

Referring now to FIGS. 5a to 5c, there is illustrated alternative preferred embodiments for the decoder circuit 206 of FIG. 4. FIG. 5a illustrates the decoder circuit 206 having the configuration of a conventional NAND gate 222 having L input terminals. FIG. 5b illustrates the decoder circuit 206 in the configuration of a NAND gate 224 having L input terminals, wherein each input terminal is coupled to a 2 to 1 MUX 226. Each 2 to 1 MUX 226 has its respective input terminals 228, 230 associated with a common node 232, wherein intermediate node 232 and input terminal 230 is a conventional inverter 234. The address selector 236 of MUX 226 is coupled to and controlled by a 1-bit static random access memory (RAM) 238. FIG. 5c illustrates the MUX 226 of FIG. 5b comprised of first and second transistors 240 and 242, wherein the base of each respective transistor 240, 242 is coupled to the 1-bit static RAM 238 so as to be activated or de-activated thereby. It is to be appreciated that the decoder circuit 206 of FIG. 4 may be configured in numerous circuit schemes, (e.g., NAND gate 224 may be replaced with an AND gate) and is not to be limited to those illustrated in FIG. 5.

Figure 6:
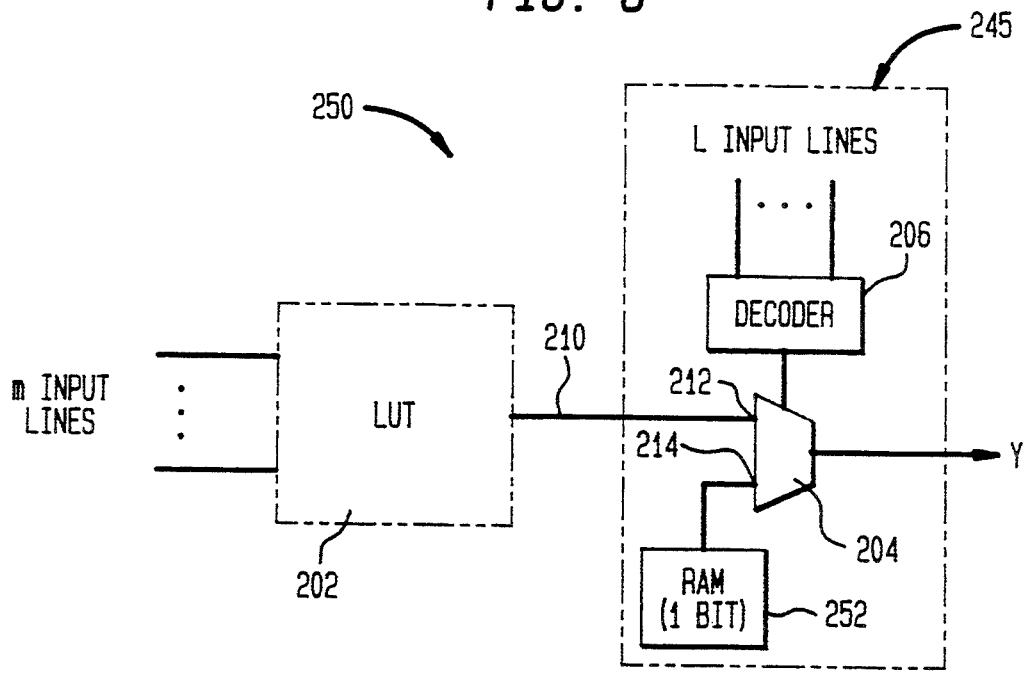
FIG. 6 illustrates the decoder circuit arrangement of FIG. 4 having the provision of a 1-bit static RAM oper

FIG. 6 illustrates yet another preferred embodiment of a decoder circuit arrangement 245 in a PLC 250 in accordance with the present invention. Decoder circuit arrangement 245 is substantially similar to decoder circuit arrangement 203 of FIG. 4, with the exception that the second input terminal 214 of MUX 204 is coupled to a 1-bit static RAM 252. The provision of RAM 252 enables a user to adapt MUX 204 to have a default value of either 0 or 1.

Figure 7:
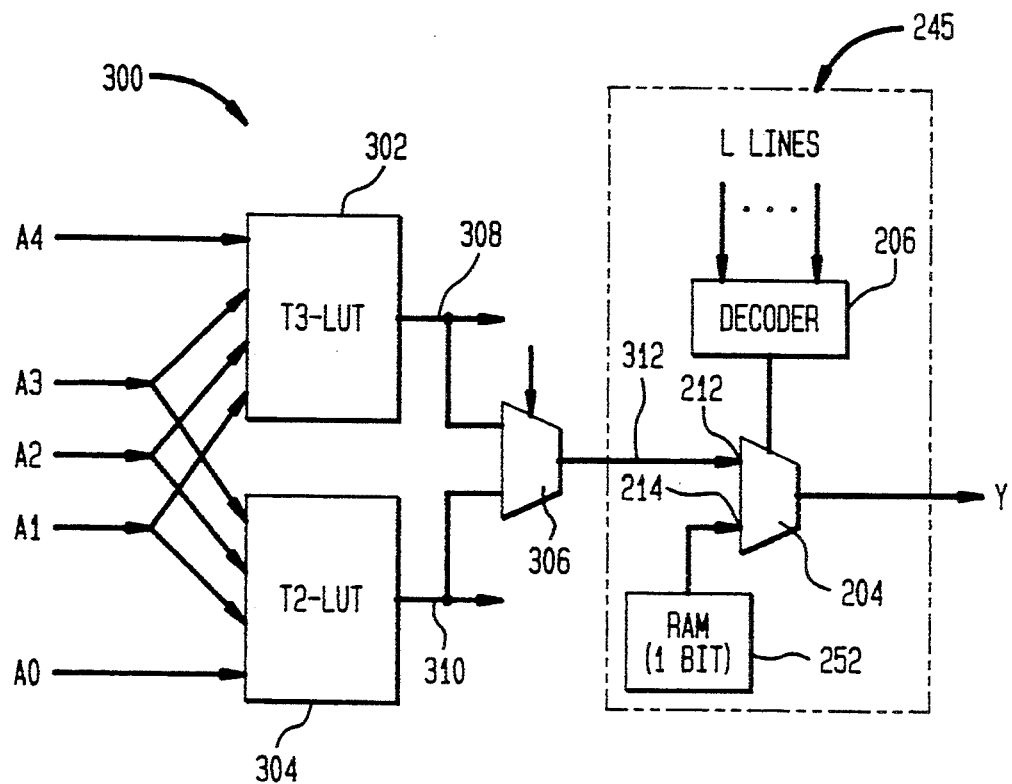
- FIG. 7 illustrates the decoder circuit arrangement of FIG. 6 employed in a programmable logic cell having first and second look-up tables.

FIG. 7 illustrates an example of the implementation of the present invention decoder circuit arrangement into an existing FPGA. Illustrated in FIG. 7, is the implementation of the decoder circuit arrangement 245 of FIG. 6 into a PLC 300 of an aforementioned AT&T ORCA FPGA. It is to be appreciated that, for convenience, only the top two LUTS 302, 304 of the ORCA FPGA are illustrated. LUTS 302 and 304 are 16-bit LUTs wherein each LUT 302, 304 is provided with four inputs (m =4). Three inputs of each respective LUT 302, 304 are combined with one another (A1, A2 and A3), such that the total number of inputs to LUTS 302 and 304 is 5 (m=5, A0, A1, A2, A3 and A4). The outputs of each LUT 302 and 304 are respectively coupled to a 2 to 1 MUX 306, via lines 308, 310. The output of MUX 306 is coupled to the first input terminal 212 of the aforementioned MUX 204, via line 312. Therefore, the aforementioned decoder circuit arrangement 245 is enabled to cooperatively function with the PLC 300 of the ORCA FAGA, and as mentioned above, decoder circuit arrangement 245 is operative to increase the number of inputs to PLC 300 by L (the number of inputs to the decoder circuit 206). For example, if decoder circuit 206 is adapted to have three inputs (L=3), then the total number of inputs (K) to the PLC 300 is eight (K=8=5+3=m+L).

Figure 8:
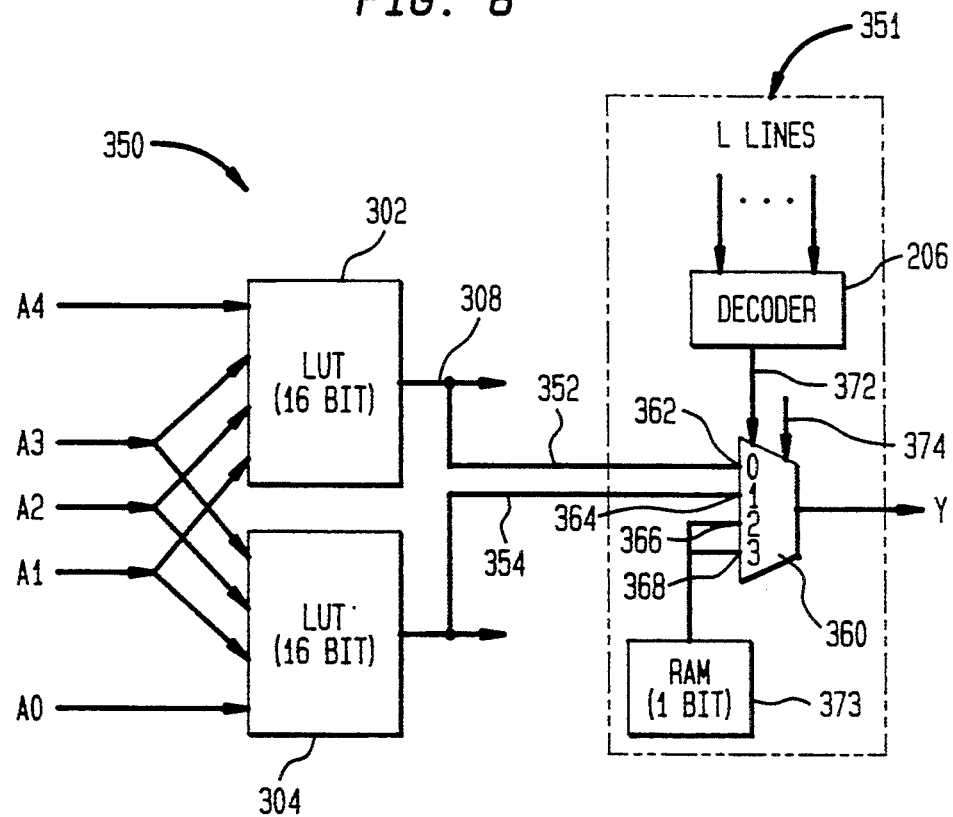
FIG. 8 illustrates the decoder circuit arrangement of FIG. 7 incorporating a 4 to 1 multiplexer.

Turning now to FIG. 8, them is illustrated another preferred embodiment of a PLC 350 of the aforementioned ORCA FPGA implementing the decoder circuit 351 of the present invention. PLC 350 is substantially similar to PLC 300 of FIG. 7, with the exception that PLC 350 is provided with a 4 to 1 MUX 360 in contrast to the two 2 to 1 MUXs 306, 204 of PLC 300 of FIG. 7. PLC 350 includes the aforementioned 16-bit LUTs 302, 304, wherein the respective outputs of LUTs (lines 303 and 305) 302, 304 am respectively inputted to first and second inputs terminals 362, 364 of MUX 360, via lines 352, 354. The L-input decoder circuit 206 is coupled to a first address selector terminal 372 of MUX 360, and input terminals 366 and 368 of MUX 360 are coupled to a 1-bit static RAM 373 which is operative to provide a default value of either 0 or 1.

In operation, when the output of the decoder circuit 206 is active low (0), the output (Y) of MUX 360 is selected from either the output value of LUT 302 or LUT 304, via input terminals 362, 364 in dependence upon the value inputted into the second address selector terminal 374. Therefore, the output (Y) of MUX 360 has the value of either LUT 302 or LUT 304. If the output of the decoder circuit 206 is inactive (1), then the output (Y) of MUX 360 equates with the output of RAM 373, via input terminals 366, 368.

It is to be appreciated that the above mentioned decoder circuit arrangement 351 may be coupled to every LUT in a FPGA and is not to be limited to the top two LUTs of a FPGA. Therefore, as mentioned above, each decoder circuit arrangement employed in a particular PLC is effective to correspondingly increase the number of inputs (K) to that particular PLC.

To further illustrate the present invention, as an example, an 8-input combinational logic function is illustrated in TABLE A. It is to be appreciated by one skilled in the art that this function typically has too many variables for intended applications, and consequently it must be "decomposed" into a set of smaller functions. TABLE B illustrates three (3) smaller combinational functions produced by commercially available software, such as SIS 1.1 from U.C. Berkley. It is noted that the combination of the three (3) functions illustrated in TABLE B is logically equivalent to the function illustrated in TABLE A as shown hereinbelow.

TABLE A cover y : y_cov (
 a1 a2 a3 a4 a5 a6 a7 8a
 00111010 1, 00010-00 1,
 1011-1-0 1, 10011000 1,
 01100111 1, 01001-01 1,
 111000-1 1, 11001111 1);

TABLE B cover y : y_cov (
 a2 a4 a8 tmp1 tmp2,
 10101 1,
 0101- 1);
cover tmp1 : tmp1_cov (
 a1 a3 a5 a6 a7,
 11-1- 1,
 000-0 1,
 01101 1,
 10100 1);
cover tmp2 : tmp_cov (
 a1 a3 a5 a6 a7, TABLE B-continued

Figure 9:
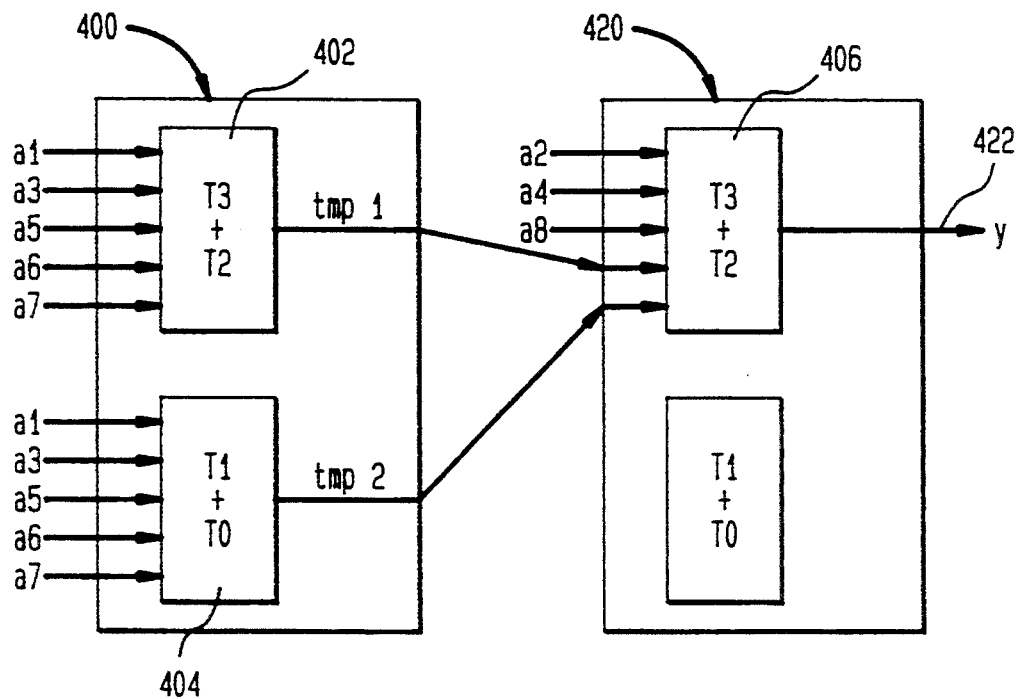
FIG. 9 illustrates a prior art FPGA having two programmable logic cells in tandem with one another.

110-- 1,
 00--0 1,
 1-111 1,
 -1011 1);

The aforementioned logic function depicted in TABLES A and B can be implemented in the aforementioned prior art AT&T ORCA FPGA implementing two PLCs (PLC 400 and PLC 420) as shown in FIG. 9. In PLC 400, LUTs T3 and T4 (402) provide the "tmp1" cover output, and LUTs T1 and T0 (404) provide the "tmp2" cover output, wherein LUTs T3 and T2 (402) and LUTs T1 and T0 (404) are each respectively provided with five inputs (a1, a3, a5, a6, a7). The tmp1 and tmp2 cover outputs are respectively inputted into LUTs T3 and T2 (406) of PLC 420, wherein LUTs T3 and T2 (406) are also provided with three additional inputs (a2, a4, a8). LUTs T3 and T2 (406) of PLC 420 provide the 'y' cover output (line 422). It is noted that the aforementioned FPGA circuit arrangement of FIG. 9 required two levels of PLCs 400, 420 to implement the 'y' cover having eight inputs. Therefore, the aforementioned input signals (a1 thru a8) were required to be processed by two levels of PLCs 400, 420 before the 'y' cover output signal is generated. Thus, as mentioned above, the additional PLC 420 level effects an increase in the overall size of the FPGA required to accommodate PLC 420, as well as an increase in the signal propagation time and cost for the FPGA.

Figure 10:
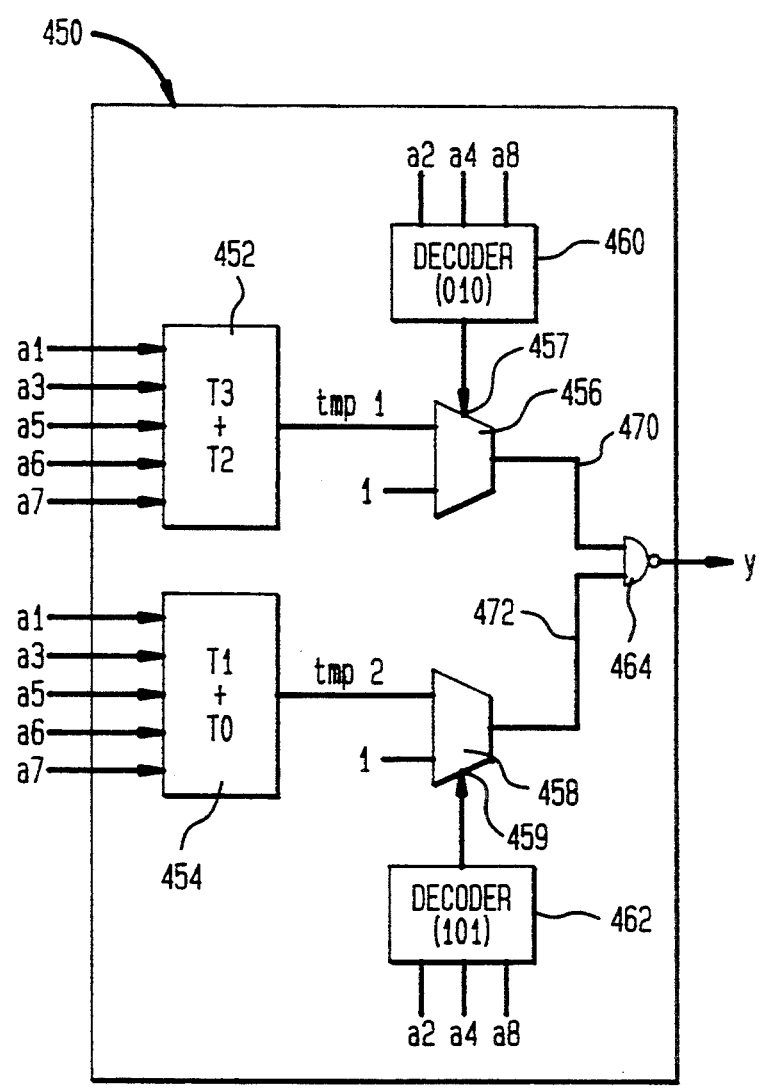
FIG. 10 illustrates a FPGA having a single programmable logic cell incorporating the decoder circuit arrangement embodying the present invention.

In contrast to the prior art FPGA of FIG. 9, FIG. 10 illustrates a PLC 450 of the aforementioned AT&T ORCA FPGA implementing the decoder circuit arrangement of the present invention. PLC 450 includes LUTs T3 and T2 (452) and LUTs T1 and T0 (454), each respectively having the aforementioned five inputs (m=5) a1, a3, a5, a6, and a7. The 'tmp 1' output from LUTs T3 and T2 (452) is coupled to a 2 to 1 MUX 456 while the 'trap 2' output from LUTs T1 and T0 (454) is coupled to a second 2 to 1 MUX 458. MUX 456 has its address selector 457 coupled to decoder circuit 460, while MUX 458 has its address selector 459 coupled to decoder circuit 462. The outputs (lines 470 and 472) of each MUX 458, 460 are respectively coupled to a NAND gate 464 whose output provides the 'y' cover. Decoder circuits 460 and 462 are each respectively provided with the aforementioned three inputs (L=3) a2, a4 and a8. In particular, decoder circuit 460 is adapted to be active low (0) when inputs a2, a4 and a8 are respectively 010, and decoder circuit 462 is adapted to be active low (0) when inputs a2, a4 and a8 are respectively 101.

Therefore, the FPGA circuit arrangement of FIG. 10, in accordance with the present invention, provides the identical 'y' output utilizing the same eight inputs (K=8, a1 to a8), in comparison to the prior art FPGA circuit arrangement of FIG. 9. However, the FPGA circuit arrangement of FIG. 10 achieves such identical results by employing only one PLC 450, in contrast to the two PLCs 400, 420 required for the aforementioned prior art FPGA circuit arrangement of FIG. 9. Thus, the present invention FPGA circuit arrangement (FIG. 10) is advantageous in that it requires less overall size, reduces delay time (input signals need only be processed in one PLC 450), and reduces the cost of circuitry in comparison to a prior art FPGA circuit arrangement requiring two levels of PLCs 400 and 420.

What has been described is merely illustrative of the application of the principles of the present invention. Other arrangements and methods can be implemented by those skilled in the art without departing from the spirit and scope of the invention.

What is claimed is:

1. An integrated circuit comprising a field programmable gate array having:
   (a) at least one look-up table having a plurality of input terminals and an output terminal;
   (b) a decoder circuit arrangement coupled to said output terminal of said at least one look-up table, said decoder circuit arrangement including:
      (i) a multiplexing circuit having an address selector terminal and at least one input terminal, said at least one input terminal being connected to said output terminal of said at least one look-up table; and
      (ii) a decoder circuit having a plurality of inputs, said decoder circuit being coupled to said address selector of said multiplexing circuit.

2. An integrated circuit as recited in claim 1, wherein said multiplexing circuit includes a 2 to 1 multiplexer having a first input terminal connected to said output terminal of said at least one look-up table and a second input terminal connected to a default valve, said 2 to 1 multiplexer having said address selector coupled to said decoder circuit enabling said decoder circuit to selectively couple said output terminal of said multiplexer between said first and second input terminals of said multiplexer.

3. An integrated circuit as recited in claim 2, wherein said decoder circuit arrangement further includes a 1-bit static RAM connected to said second input terminal operative to provide said default value.

4. An integrated circuit as recited in claim 1, wherein said decoder circuit includes a NAND logic gate having a plurality of input terminals and an output terminal connected to said address selector of said multiplexing circuit.

5. An integrated circuit as recited in claim 4, wherein each said input terminal of said NAND gate is coupled to a 2 to 1 multiplexer.

6. An integrated circuit as recited in claim 5, wherein each said 2 to 1 multiplexer includes a 1-bit static RAM connected to each address selector of each said 2 to 1 multiplexer.

7. A field programmable gate array integrated circuit having a multiplicity of programmable logic cells, each said programmable logic cell comprising:
   (a) a multiplicity of look-up tables, each said look-up table having a plurality of input terminals and an output terminal;
   (b) a first multiplexer circuit having its input terminals connected to each said output terminal of each said lookup table;
   (c) a decoder circuit arrangement coupled to said output terminal of said first multiplexing means, said decoder circuit arrangement including:
      (i) a second multiplexer circuit having an input connected to an output of said first multiplexing means; and
      (ii) a decoder circuit having a plurality of inputs, said decoder circuit being coupled to an address selector of said second multiplexing means.

8. A field programmable gate array as recited in claim 7, wherein said first multiplexing means is a 2 to 1 multiplexer having its respective input terminals connected to said first and second look-up tables.

9. A field programmable gate array as recited in claim 8, wherein said second multiplexing means includes a second 2 to 1 multiplexer having a first input connected to said output of said first 2 to 1 multiplexer and an address selector connected to said decoder circuit.

10. A field programmable gate array as recited in claim 9, wherein a 1-bit static RAM is connected to a second input of said second 2 to 1 multiplexer.

11. A field programmable gate array as recited in claim 10, wherein said decoder circuit includes a NAND logic gate having a plurality of input terminals and an output terminal connected to said address selector of said second 2 to 1 multiplexer.

12. A field programmable gate array as recited in claim 11, wherein each said input terminal of said NAND gate is coupled to a 2 to 1 multiplexer.

13. A field programmable gate array integrated circuit having a multiplicity of programmable logic cells, each said programmable logic cell comprising:
   a) a multiplicity of look-up tables, each said look-up table having a plurality of input terminals and an output terminal;
   b) a multiplicity of multiplexer circuits, wherein each said multiplexer circuit has an input terminal connected to a said output terminal of a said look-up table;
   c) a multiplicity of decoder circuits, with each said decoder circuit being connected to an address selector of a said multiplexer circuit; and
   d) a logic control circuit having a plurality of input terminals and an output terminal, each said input terminal being connected to an output terminal of each said multiplexer circuit.

14. A field programmable gate array as recited in claim 13, wherein said logic control circuit is a NAND gate.

15. A field programmable gate array as recited in claim 14, wherein each said multiplexer circuit is a 2 to 1 multiplexer.

* * * * *